United States Patent [19]

Hollis et al.

[11] Patent Number: 4,631,420
[45] Date of Patent: Dec. 23, 1986

[54] DYNAMIC FLIP-FLOP WITH STATIC RESET

[75] Inventors: Ernest E. Hollis, Bedford; Joseph H. Born, Boston, both of Mass.

[73] Assignee: Sanders Associates, Inc., Nashua, N.H.

[21] Appl. No.: 578,445

[22] Filed: Feb. 9, 1984

[51] Int. Cl.$^4$ .................... H03K 3/284; H03K 17/56
[52] U.S. Cl. ................................ 307/272 R; 307/246; 307/445; 307/269
[58] Field of Search ............... 307/465, 480, 481, 269, 307/276, 272 R, 272 A, 246, 271, 279, 445; 377/79, 73, 81

[56] References Cited

U.S. PATENT DOCUMENTS

| 3,739,193 | 6/1973 | Pryor | 307/243 |
| 3,812,384 | 5/1974 | Skorup | 307/269 |
| 3,993,916 | 11/1976 | Copeland, III et al. | 377/79 |
| 4,114,052 | 9/1978 | Manabe et al. | 307/289 |
| 4,181,862 | 1/1980 | Dingwall | 307/279 |
| 4,492,927 | 1/1985 | Holberg | 328/162 |
| 4,495,628 | 1/1985 | Zasio | 307/272 A |

FOREIGN PATENT DOCUMENTS 0079524 6/1980 Japan .......................... 307/272 A Primary Examiner—Stanley D. Miller
Assistant Examiner—Timothy P. Callahan
Attorney, Agent, or Firm—Louis Etlinger; Wm. F. Porter, Jr.

[57] ABSTRACT

A D-type flip-flop (10) receives the D input on an input line (14) of a transfer gate (12) that also receives the flip-flop clock signal. A state gate (20) forwards the transmission-gate output when the signals on two of its input lines (22) and (24) remain true. To reset the flip-flop asynchronously, a false signal is imposed on one of the input lines (22) of the state gate (20). By coordination of a second clock signal, which is applied to a second transmission gate (34), with the reset signal, the reset condition is held until the next clock pulse on the first transmission gate (12). The flip-flop ordinarily operates as a dynamic circuit, but, in order to maintain the reset condition in circumstances in which the reset state is to be maintained for an extended period of time, a latch gate (26) is enabled by a true signal on one of its input lines (32) to feed the reset output of the state gate 20 to one of its input terminals (24) so as to latch the flip-flop in the reset state.

4 Claims, 3 Drawing Figures

DYNAMIC FLIP-FLOP WITH STATIC RESET

BACKGROUND OF THE INVENTION

The present invention is directed to flip-flops, particularly those of the type employed in dynamic synchronous circuits.

One of the basic elements of many digital systems is the D-type flip-flop. The D-type flip-flop is often used as a *synchronous* device; the value of its output depends on the value that its input had at the occurrence of the most recent clock signal. In some systems, however, it is desired to be able to reset the D-type flip-flop *asynchronously*, too; i.e., to reset the flip-flop at a time that is independent of the clock signal. Typically, a reset input terminal is provided, and pulsing the terminal resets the flip-flop.

If the flip-flop is a dynamic circuit—i.e., if it must be refreshed periodically—retention of a given state usually depends on capacitances in the circuit that are able to maintain the necessary charge until the next refresh of the circuit. In some circumstances, however, it is desirable for a dynamic circuit to have the additional capability of being reset in a static manner. For instance, if a synchronous circuit is to be initialized so that all of its flip-flops are reset before the clocking operations begin, the capacitances in the flip-flops will not in general be great enough to maintain the reset condition until synchronous operation starts. Accordingly, additional circuitry is required to provide the static-reset feature, i.e., to keep the flip-flops reset indefinitely. But such additional circuitry can slow the flip-flop considerably.

It is accordingly an object of the present invention to afford the static-reset feature with a minimum of additional circuitry and thereby minimize the reduction in speed that the addition of a static-reset feature causes.

SUMMARY OF THE INVENTION

The foregoing and related objects are achieved in a flip-flop that includes first and second transmission gates. The output port of the first transmission gate is electrically connected to an input terminal of a NAND gate, which will be referred to as the "state gate." The first transmission gate receives as its input the D input to the flip-flop. It also receives a clock input, which switches the first transmission gate between an enabled state, in which it forwards the D input to the state-gate input terminal, and a disabled state, in which it holds at the state-gate input terminal the value that the D input had when the transmission gate was previously disabled.

A second transmission gate receives the output of the state gate and is clocked in such a relationship with the clocking of the first transmission gate that the D input values reflected in the output of the second transmission gate are only those that are present at the times when the first transmission gate is disabled. The output port of the second transmission gate is adapted for connection to a capacitive load, typically an inverter, whose output is the Q output of the flip-flop.

In this simple circuit, the flip-flop can be reset asynchronously by applying a false signal to another, reset input port of the state gate. To maintain the reset condition statically, a latch gate can be provided that receives as one input the output of the state gate. The latch gate applies its output as another, latch input to the state gate. The latch gate thereby provides a feedback path, and this feedback path is controlled by an enable signal fed to another terminal of the latch gate.

When the latch and reset inputs to the state gate are true, the state gate simply presents an output that reflects the value of the signal held at its remaining, or data, input terminal by the first transmission gate, and the second transmission gate forwards only signals that reflect the values that the output of the first transmission gate has when that gate is disabled. In this mode, therefore, the circuit performs synchronously in the normal manner of a D-type flip-flop.

When a false signal is applied to the reset input terminal of the state gate, the state gate goes to its reset state independently of the timing of the clock signals at the transmission gate and independently of the value of the D input. That is, the flip-flop is reset asynchronously. In order to maintain the reset condition statically after the signal at the reset terminal of the state gate returns to true, an enable signal is held at the enable input terminal of the latch gate, enabling it to apply a false signal to the latch input terminal of the state gate when the flip-flop is reset. The reset condition can thereby be held indefinitely.

An alternative means for statically resetting the flip-flop is to employ, instead of the latch gate, a reset gate whose output is the input to the state-gate reset port. In this arrangement, the state gate has no latch input port. The reset gate receives as an input the reset signal used for asynchronously resetting the flip-flop, and it forwards this signal to the state gate to reset the flip-flop in the normal manner. For static resetting, a signal at the other input port of the reset gate is kept at an enable level for the duration of the static reset. This signal, too, is forwarded by the reset gate, which thereby holds the flip-flop reset until the enable signal is removed.

BRIEF DESCRIPTION OF THE DRAWINGS

These and further features and advantages of the present invention can be appreciated by reference to the accompanying drawings, in which.

DETAILED DESCRIPTION OF THE PREFERRED EMBODIMENT

Figure 1:
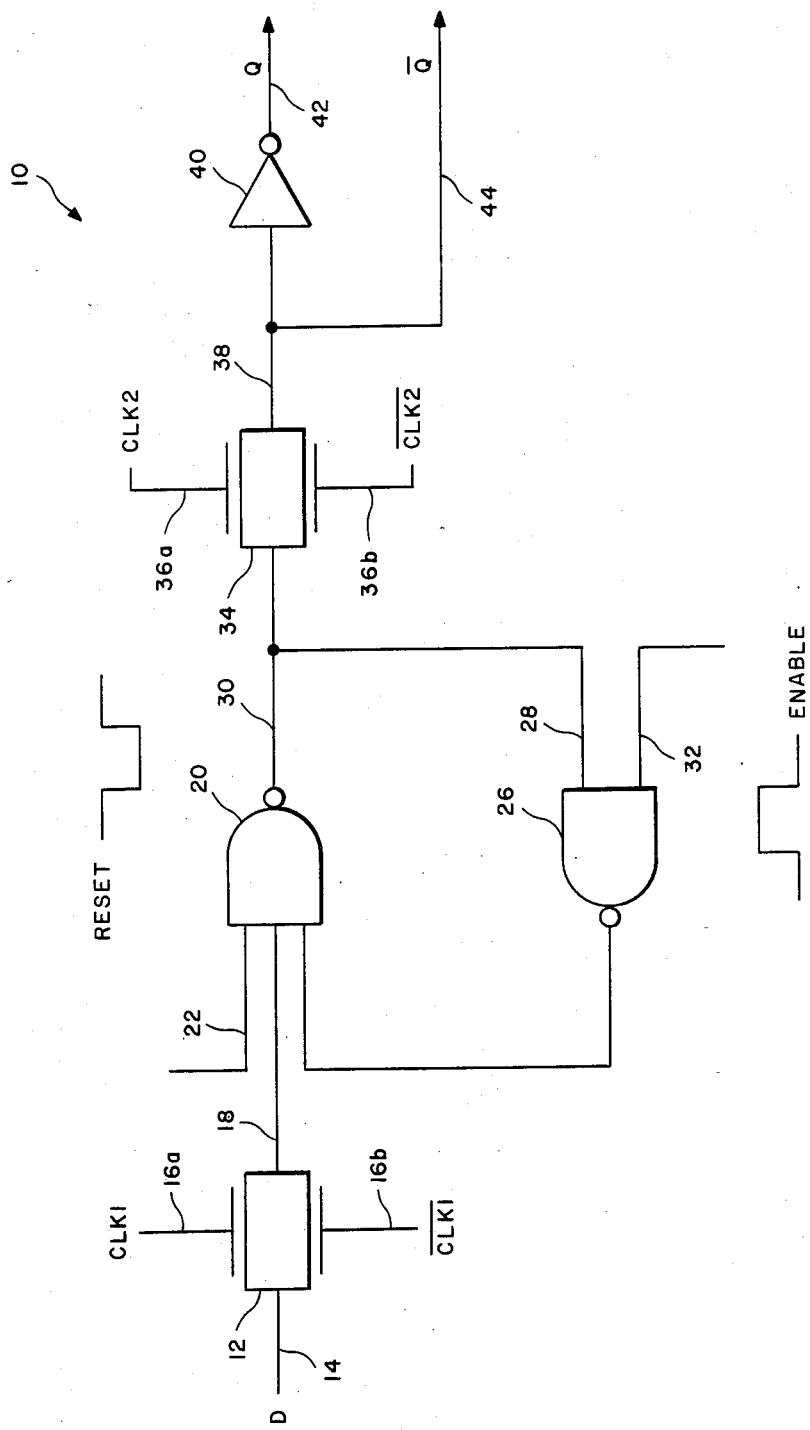
FIG. 1 is a schematic diagram of one embodiment of the flip-flop of the present invention.

One embodiment of the present invention is illustrated in FIG. 1, which shows a D-type flip-flop 10 implemented in a complementary-symmetry metal-oxide-semiconductor (CMOS) circuit. The circuit includes a transmission gate 12 that receives the D input of the flip-flop on line 14 and receives the clock signal CLK1 and its complement on lines 16a and 16b, respectively. The flip-flop delivers the Q output and its complement on lines 42 and 44, respectively.

When CLK1 is at its true level, the transmission gate 12 assumes its enabled, or transparent, state, in which the value of the signal on the input line 14 appears on the output line 18. In the other state of CLK1, transmission gate 12 is in its disabled, or hold, state, in which the transmission-gate output retains on line 18 the signal value that it had when it switched to its disabled condition. The value is retained because the high output impedance of the gate 12 when the gate is disabled tends to hold charge on the input capacitance of a NAND gate 20, referred to below as the "state gate," to which the output line 18 of the transmission gate 12 is electrically connected.

In addition to its data input on line 18, NAND gate 20 receives a reset input on line 22. For convenience and clarity, it will be assumed that the circuit is implemented in positive logic: a high voltage is a logical true and a low voltage is a logical false. As the discussion accompanying FIG. 2 will indicate, a low value on line 22 causes the flip-flop 10 to reset; i.e., its Q value goes false.

The third input to NAND gate 20 is the signal on an output line 24 of another NAND gate, "latch gate" 26. A feedback line 28 provides, as an input to the latch gate 26, the signal on the output line 30 of the state gate 20. The other input to the latch gate 26 is the signal on an enable line 32. The function of the latch gate 26 is to latch the flip-flop in its reset state when the signal voltage on the enable line 32 is high.

A second transmission gate 34 receives as its input the output of the state gate 20 on line 30. The second transmission gate is clocked by a second clock signal CLK2 and its complement on lines 36a and 36b, respectively. In ordinary synchronous operation, CLK2 may simply be the inverse of CLK1, but the two clock signals are named separately because CLK2 will typically differ somewhat from the inverse of CLK1 during an asynchronous resetting operation, as will be described below. Furthermore, even in strictly synchronous operation, it may be desired to improve the speed of the circuit by allowing some overlap between the two clock signals. The purposes of the second transmission gate 34 are to prevent premature transmission of the output to the next circuit stage and to prevent the output of the flip-flop 10 from being affected by any value of the D input other than that present at the time that the first transmission gate is disabled, i.e., other than the D value that coincides with the trailing edge of the CLK1 signal. A small overlap that is less than the signal propagation time between the two transmission gates is consistent with those purposes.

The output line 38 of the second transmission gate 34 is connected to the input terminal of an inverter 40, whose output is on the line 42 that carries the Q output of the flip-flop 10. Line 44, which carries the Q-complement output of the flip-flop 10, receives the output of the second transmission gate 34. In some specific situations, the complement output line 44 may be connected to line 30 rather than to line 38. This eliminates the propagation delay of the second transmission gate 34. Although the resultant signal on line 44 in such an instance would not strictly be the complement of the Q output—i.e., it would be a transparent-latch output rather than a flip-flop output—the difference may be acceptable in some circumstances.

Figure 2:
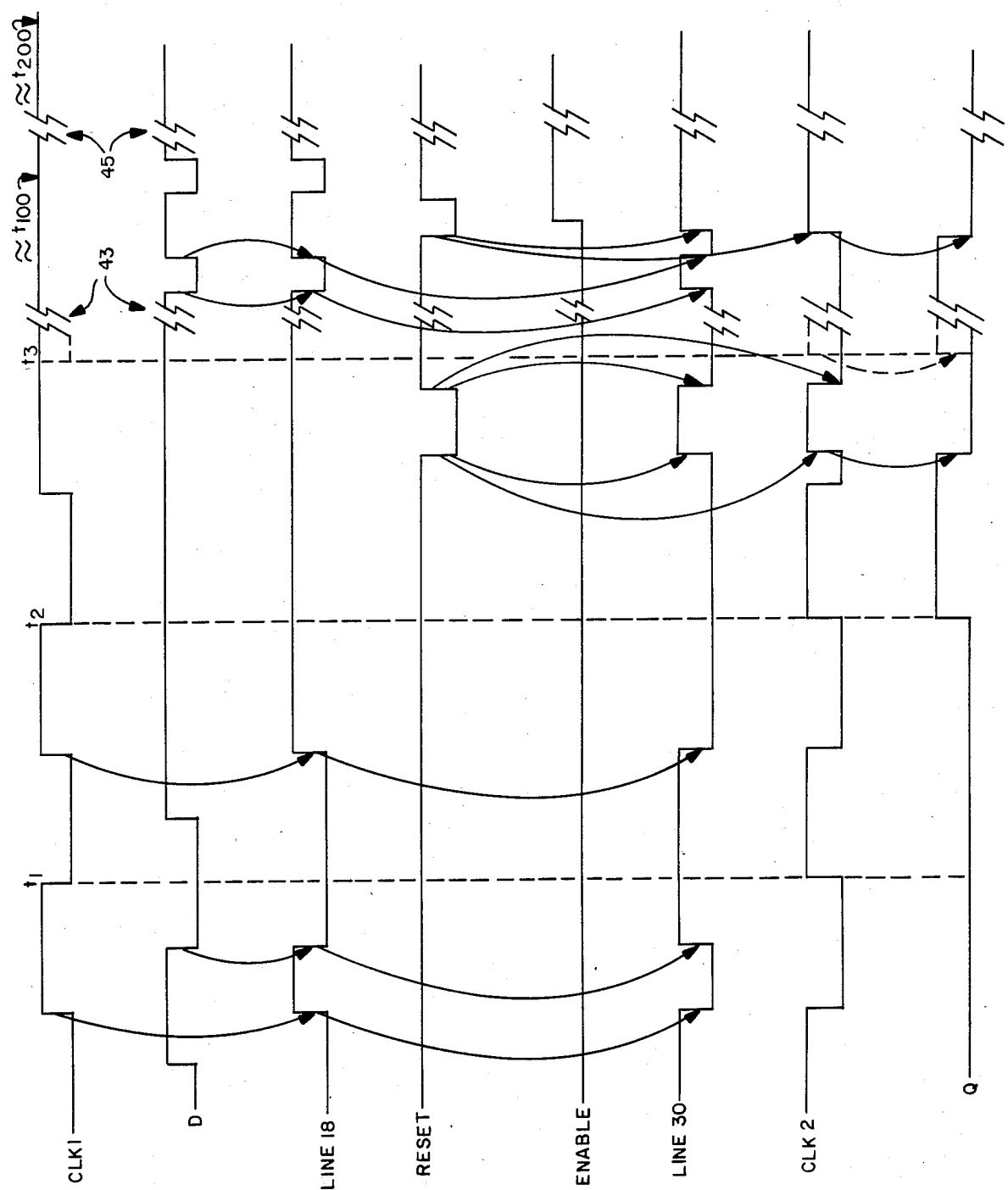
FIG. 2 is a timing diagram showing the relationships of various of the signals applied to the circuit of FIG. 1.

Description of the operation of the circuit of FIG. 1 will be carried out in connection with the timing diagram of FIG. 2, which depicts signals at various points in the circuit. The circuit will typically be implemented as a high-speed device, in which the propagation delays within the circuit are significant fractions of a clock period. As a result, these delays cannot be ignored for most design purposes. FIG. 2 omits these propagation delays for the sake of simplicity, but it should be kept in mind that the signals depicted in FIG. 2 are actually shifted somewhat in practical versions of the device.

FIG. 2 shows that CLK1 consists of a train of periodically occurring pulses. The trailing edges of these pulses represent the clock times of the circuit, and the only values of the D input that have an effect on the output state of the flip-flop 10 in synchronous operation are the ones that occur at these clock times; in general, the D input may change state between clock times, but the output on line 38 of the second transmission gate 34 does not change until the next clock time in the absence of a reset pulse.

During synchronous operation, the reset and latch inputs on lines 22 and 24, respectively, are usually high, so the output on line 30 of the state gate 20 is usually the complement of the signal on line 18. This result is shown in FIG. 2 from the beginning of the diagram through $t_2$.

In the portion of the diagram prior to $t_1$, CLK1 starts out at a low value, so the first transmission gate 12 is disabled. During this time, while CLK1 is low, the D input goes from a low value to a high value, but the signal on line 18 does not respond to this change in value until CLK1 goes high a half cycle before $t_1$. When CLK1 does go high, the first transmission gate 12 is enabled, so the subsequent high-to-low transition of the D input results in an immediate similar transition of the signal on line 18. (Again, propagation delays have been omitted from the diagram for the sake of simplicity; in a practical circuit, there is some propagation delay between the high-to-low transition of the D input and the high-to-low transition of the signal on line 18.)

Since the reset signal is high and the enable signal low during this period, the state-gate output, which is labeled "line 30" in FIG. 2, is simply the complement of the signal on line 18 in this initial portion of the diagram. Thus, there is a negative pulse in the portion of the line 30 signal that precedes $t_1$. The Q output does not respond to this pulse, however, because CLK2 goes low, and thus disables the second transmission gate 34, before the high-to-low transition on line 30 has propagated to that transmission gate.

At $t_1$, CLK1 goes low, disabling the first transmission gate 12. As was mentioned above, the only values of the D input that affect the Q output are those that coincide with the trailing edges of CLK1, and the D input has a low value at $t_1$ in the illustrated example. This value is held on line 18 for a half clock cycle after $t_1$, even though the D input changes its value in the interim. The complement of this signal appears in the state-gate output on line 30, and the high value of CLK2 enables the second transmission gate 34 to permit the line 30 signal to propagate by way of line 38 to the output inverter 40, which presents the complement of the line 38 signal on line 42. CLK1 goes high a half cycle after $t_1$, and the first transmission gate 12 thereby permits the current value of the D input to propagate onto line 18 so that its complement appears on line 30. However, CLK2 goes low when CLK1 goes high, and the second transmission gate 34 thus does not permit the Q output to respond to these interim values of the D input.

In summary, the first transmission gate is disabled at each clock time and remains disabled for a half cycle thereafter to hold the value that the D input had at the clock time. During this first half cycle, the second transmission gate allows the resultant signals through so that the output is indicative of the value that the D input had at that clock time. A half cycle after the clock time, the first transmission gate 12 opens to let new D values through, but the second transmission gate closes to hold the output until the next clock time. This is why the only values of the D input to which the Q output responds are those that coincide with clock times.

At $t_2$, the value of the D input is high, and the Q output goes high at $t_2$ in response to this value of the D input. Ordinarily, the high Q-output value would remain at least until the next clock time, $t_3$. However, the flip-flop 10 is reset between $t_2$ and $t_3$ in the FIG. 2 example because the reset line 22 goes low to cause the state-gate output on line 30 to go high. The timing circuitry (not shown) is arranged so that a low-going reset signal causes the CLK2 signal to go high, as FIG. 2 indicates, and the signal on line 30 can thus propagate through the now-enabled second transmission gate 34 to the input port of the output inverter 40, which accordingly goes low.

When the reset signal, which typically is momentary, again goes high, the state-gate output goes low in response, but the Q output remains low—i.e., the flip-flop 10 remains reset—because the CLK2 signal goes low in response to the low-to-high transition of the reset signal, disabling the second transmission gate 34 and preventing the change in the line 30 signal from propagating to the output.

Ordinarily, this reset state might change at the next clock time, $t_3$, when the transmission gate 34 would again be enabled. This normal operation is indicated in dashed lines in FIG. 2. However, the solid lines in FIG. 2 depict a situation in which clocking stops before $t_3$. The reason for depicting a stopped clock is to demonstrate the difference between a simple reset with a low enable signal, which is shown between $t_2$ and $t_3$, and a reset with a high enable signal, which is shown farther to the right.

A break in the diagram is depicted by a first set of broken lines 43, which represent a fairly long period of time so that the diagram resumes at about $t_{100}$. (The "$t_{100}$" indicates a long period of time later; it is not meant to suggest that the clock has started again.) Although the Q output begins at a low state before this long interval, and although none of the other signals depicted in FIG. 2 changes during this time, the Q output returns to a high state during time interval 43 because that time interval is long enough to permit the charge on the gate capacitance of the inverter 40 to leak off. The signal on line 38 thus goes low and the Q output goes high.

Between time interval 43 and a further time interval depicted by broken lines 45, two pulses occur in the D input. Since the CLK1 signal remains at a high level, both pulses propagate through to line 18. The reset signal is high and the enable signal is low during the first pulse, so its complement appears on line 30. Since CLK2 is low, however, the disabled second transmission gate 34 prevents this pulse from appearing in the Q output.

Between these two pulses in the D input, a pulse occurs on the reset line 22, and the enable signal goes high in the middle of the reset pulse and stays high. The high-to-low transition in the reset signal causes the state-gate output on line 30 to go high. It also causes the CLK2 signal to go high, and this high CLK2 signal enables the second transmission gate 34, which thereby permits the line 30 signal to propagate to the inverter 40, causing a low value on the Q output to indicate the reset state.

Since the state gate output on line 30 is high because of the low reset signal, the latch-gate output on line 24 goes low when the signal on the enable line 32 goes high. This latches the state gate 20 in its high-output state. Consequently, when the reset signal subsequently goes high again, the signal on the state-gate output line 30 remains high.

The clocking circuitry (not shown) is arranged so that the CLK2 signal remains high so long as the enable signal does. Thus, the high signal on the state-gate output line 30 is permitted to propagate through to the input port of the output inverter 40, causing the Q output to remain low—i.e., causing the flip-flop 10 to remain reset.

The second pulse in the D input, although permitted by the first transmission gate 12 to propagate through to line 18, does not affect the Q output, because, once the state-gate output is high, the high enable signal keeps it high regardless of the values of the other inputs to the state gate 20.

Unlike the first interval 43, the second interval 45 does not result in a change of the Q output. This is because the duration of the Q output when the enable line is high does not depend on the length of time that the second transmission gate 34 can keep a charge on the gate capacitance of the output inverter 40. While the enable signal stays high, the output of the state gate 20 remains high, and the Q output on line 42 remains low because the second transmission gate 34 is enabled. Thus, the circuit of FIG. 1 has provision for a static reset: the reset state can be held indefinitely if the enable signal remains at a high value.

Figure 3:
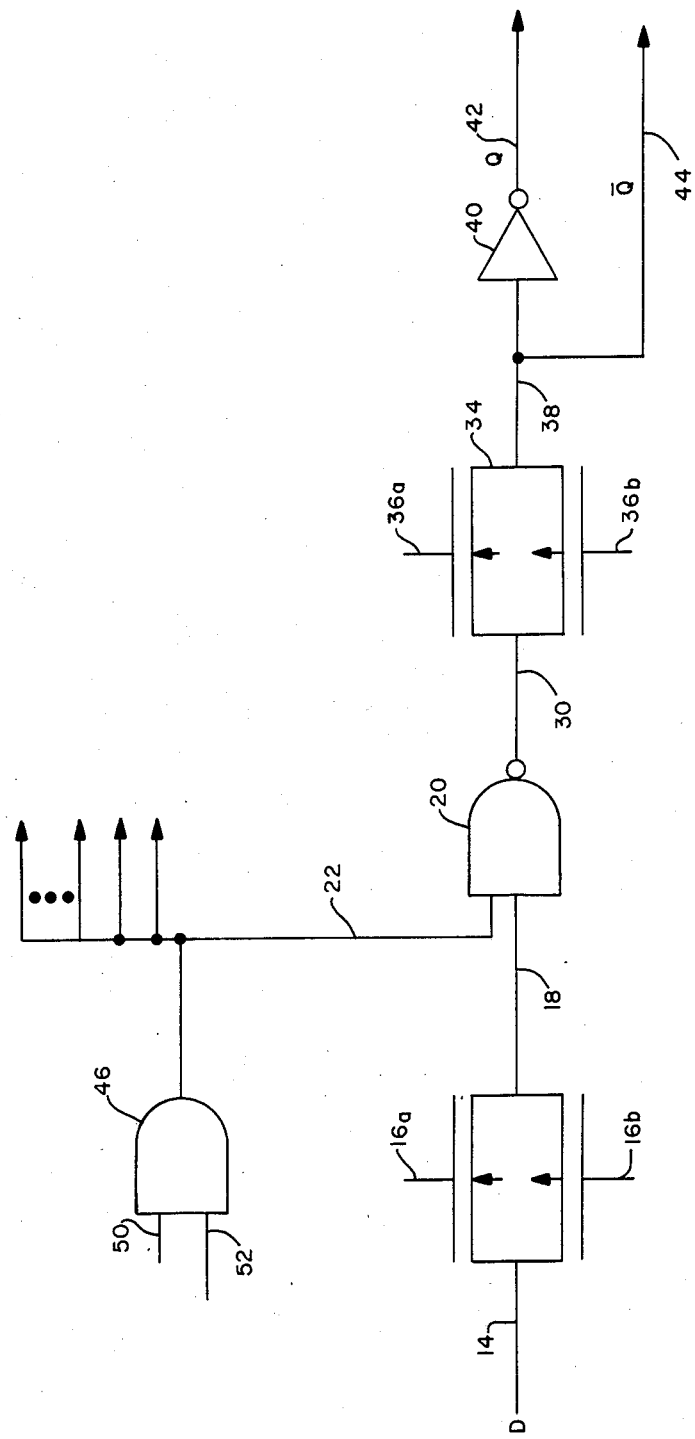
FIG. 3 is a schematic diagram of another embodiment of the present invention.

An alternate version of the circuit of the present invention is depicted in FIG. 3, in which corresponding reference numerals refer to elements whose operation is essentially the same as that of correspondingly numbered elements in FIG. 1. Comparison of the circuits of FIGS. 1 and 3 reveals that there are two basic differences between the circuits. First, the circuit of FIG. 3 does not include the latch gate 26 employed in the FIG. 1 circuit to provide feedback to latch a reset condition. As a result, the state gate 20 in the FIG. 3 circuit has only two input lines. Another result is that the FIG. 3 circuit is slightly faster than that of FIG. 1 because the state gate 20 drives only the second transmission gate 34 in the FIG. 3 arrangement.

The other difference is that the reset input line to the state gate 20 in FIG. 3 receives the output of an AND gate 46. AND gate 46 receives as inputs signals on two input lines 50 and 52. The functions of these signals are similar but not exactly the same as those of the signals on lines 22 and 32, respectively, of FIG. 1.

Specifically, the signal on line 52 of FIG. 3 is normally high, and the signal on line 50 can go low to reset the flip-flop asynchronously. Thus, the flip-flop of FIG. 3 operates in a manner essentially the same as that of the flip-flop of FIG. 1 during synchronous operation, whether or not the flip-flop is additionally reset asynchronously.

The difference in operation occurs when the flip-flop is to be reset statically. In order to reset the FIG. 3 flip-flop statically, a low static-reset signal is placed on input line 52 to the AND gate 46. The signal on line 52 is held so long as the reset condition is to be held. An advantage of the circuit of FIG. 3 is that a single gate 46 can be used to provide the static-reset function to all of the flip-flops in a given circuit. Thus, one gate per flip-flop is saved.

In summary, by following the teachings of the present invention, it is possible to provide a dynamic D-type flip-flop with an asynchronous-reset feature as well as a static-reset feature in a circuit containing as few as two transmission gates, one two-input NAND gate, and an inverter per flip-flop plus a common gate for the static-reset feature. Furthermore, the circuit is provided in an arrangement having a minimum of internal capacitive loading. These features are particularly important in high-speed complementary-symmetry metal-oxide-semiconductor circuits, contributing significantly to the speed of the circuit and keeping its power requirements to a minimum.

What is claimed as new and desired to be secured by Letters Patent of the United States is:

1. An asynchronously resettable high-speed dynamic flip-flop comprising:
   A. a state gate, having an output port and reset and data input ports, for presenting a first, set value at its output port when the values at its input ports, including a latch input port, are all true and for presenting a second, reset value at its output port when at least one of the values at its input ports is false;
   B. a first transmission gate, having an input port, a clock port, and an output port connected to the data input port of the state gate, for presenting at its output port the value of the signal at its input port when the signal at its clock port has a first, enabling value and for maintaining at the state-gate input ports, while the signal at its clock port has a second, disabling value, the value that the signal at its input port had when the signal at its clock port assumed the disabling value;
   C. a second transmission gate having a clock port, an output port connected to a capacitive load, and an input port connected to receive the signal at the output port of the state gate, for presenting at its output port the value of the signal at its input port when the signal at its clock port is has a first, enabling value and for maintaining on said capacitive load connected to its output port, while the signal at its clock port has a second, disabling value, the value that the signal at its input port had when the signal at its clock port assumed the disabling value, the flip-flop thereby operating synchronously as a D-type flip-flop when appropriate clock signals are applied to its clock input ports but being asynchronously resettable by application of a false signal to its reset input port;
   D. a latch gate having a feedback input port connected to receive the state-gate output, the latch gate also having an enable input port and having an output port connected to the latch input port of the state gate, the latch gate presenting at its output port a false value when the signal at its enable port has a first, enable value and the output of the state gate is at its reset value, the output of the latch gate being true when the signal at its enable port has a second, disable value or the output of the state gate is at its set value, the flip-flop, once it has assumed its reset state, remaining in said reset state only so long as the signal at the enable input port has the enable value, and selectively being returned to a state in which the signal on the output port of the flip-flop becomes equal to the signal of the data input to the flip-flop after the flip-flop has been clocked and a suitable propagation time has elapsed upon the signal at the enable input port returning to the disable value.

2. A flip-flop as recited in claim 1 further including an inverter whose input port is connected to receive the output of the second transmission gate, the inverter thereby serving as the capacitive load for the second transmission gate, its output thereby serving as an output of the flip-flop.

3. A flip-flop as recited in claim 1 further including a reset gate, having reset and enable input ports and an output port connected for application of the reset-gate output to the reset input port of the state gate, for applying a *false* value as the input to the reset port of the state gate when the signal at the reset input port of the reset gate is at a first, reset value or when the signal at the enable input port of the reset gate is at a first, enable value but applying a *true* value otherwise, asynchronous resetting of the flip-flop thereby being possible by application of a reset signal to the reset-gate reset input port, and maintenance of the reset state after removal of the reset value from the reset-gate reset input port thereby being possible by maintaining an enable signal on the reset-gate enable port.

4. A flip-flop as recited in claim 3 further including an inverter whose input port is connected to receive the output of the second transmission gate, the inverter thereby serving as the capacitive load for the second transmission gate, its output thereby serving as an output of the flip-flop.

* * * * *